United States Patent [19]

Schuller

[11] 4,225,948

[45] Sep. 30, 1980

[54] SERIAL ACCESS MEMORY DEVICE

[75] Inventor: Walter H. Schuller, Zandvoort, Netherlands

[73] Assignee: FDS Fast Digital Systems S.A. of Thonex, Thonex, Switzerland

[21] Appl. No.: 949,251

[22] Filed: Oct. 6, 1978

[30] Foreign Application Priority Data

Oct. 11, 1977 [CH] Switzerland .................. 12380/77

[51] Int. Cl.² ........................................... G11C 8/00
[52] U.S. Cl. ................................................ 365/239
[58] Field of Search ..................................... 365/239

[56] References Cited

U.S. PATENT DOCUMENTS

| 3,665,396 | 5/1972 | Forney | 365/239 |
| 3,851,313 | 11/1974 | Chang | 365/239 |
| 3,962,689 | 6/1976 | Brunson | 365/239 |
| 4,120,048 | 10/1978 | Fuhrman | 365/239 |

Primary Examiner—Stuart N. Hecker
Attorney, Agent, or Firm—Cushman, Darby & Cushman

[57] ABSTRACT

A serial access memory device is disclosed which comprises a random access memory and a synchronous address counter. The address counter is arranged for generating successive address codes which differ by only one bit from each other. The write-enable input signal is continuously effective for writing during the whole recording period. Considerable increase in the recording speed of the memory is obtained.

4 Claims, 9 Drawing Figures

Ram With Address Decoders

SERIAL ACCESS MEMORY DEVICE

BACKGROUND OF THE INVENTION

The present invention relates to serial access memory devices to be used for recording serial information during a very short time period. The read-out of this stored information can usually extend over a longer period.

A shift register is generally used to record such serial information. However, when the required shift frequency needs to be high, the bit capacity of the available shift registers is rather limited. For example the circuit MC 10141 made by Motorola, Inc. has a capacity of 4 bits.

To obtain serial access memories for high bit capacity, random access memories (RAM) using a binary counter as sequential address counter have also been used. However, in this case the recording speed is limited due to precautions to be taken in order to assure that desired data information is written into the correct memory location and that no other locations are unintentionally disturbed during the write-operation (see f.i. the article of J. J. McDowell "Memory systems terminology" published in "Semi-conductor Memories, Data, Application, Reliability Report," Monolithic Memories, Inc. 1975, pages 240 to 242 and "Fairchild bipolar memory data book", 1976, pages 4–8 and 4–9).

One important reason for the limitation of the recording speed of a serial access memory consisting of a binary addressed random access memory is the dispersion of the arrival times of the address signal and the dispersion of the transitions of the write-enable signal, as will be shown hereunder.

It can be noted that it is possible to increase the recording speed by multiplexing techniques in a similar way as proposed by Brady H. Warner, Jr., in the review "Electronic design" 1, Jan. 4, 1977, page 123. However, increasing the recording speed by such multiplexing techniques is less attractive because of the complexity and high price of the corresponding device.

OBJECT AND SUMMARY OF THE INVENTION

A main object of the present invention is to provide a serial access memory device of a substantially simpler and less expensive structure than the known devices for recording serial data at high speed and with a high recording capacity.

In accordance with the invention a serial access memory device comprises a usual random access memory in combination with an address code generator controlled by a clock signal and arranged for successively producing binary address codes which each differ by only one bit from the preceding one.

The objects and features of the invention will be better understood from the following description of a preferred embodiment.

Figure 1:
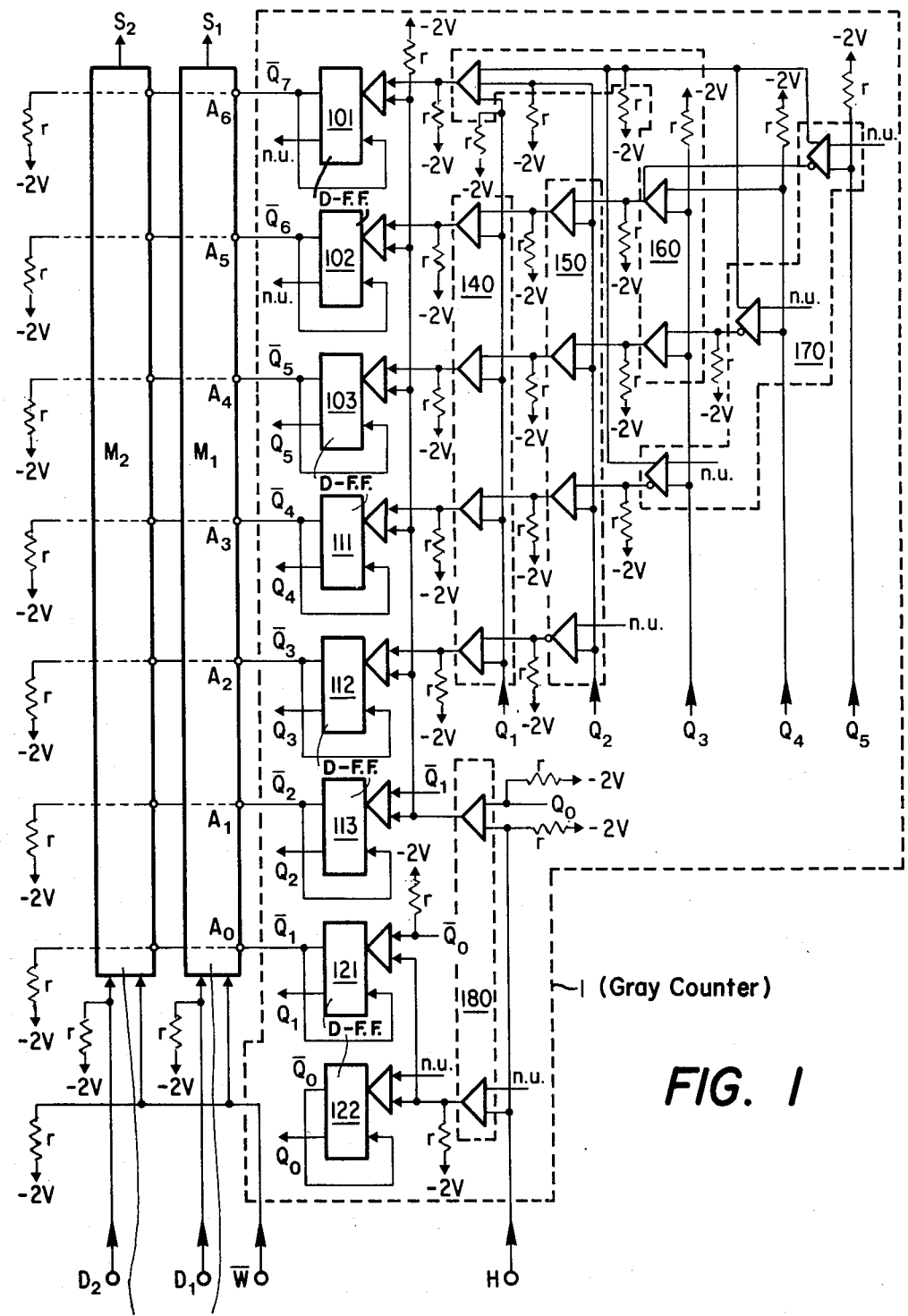
FIG. 1 is a schematic diagram of a memory device according to the invention using a synchronous Gray counter as sequential address counter.

The memory device shown in FIG. 1 comprises a random access memory (RAM) including N memory units $M_1, M_2, \ldots, M_N$ each unit incorporating on the same monolithic crystal an associated address decoder. For example, the memory units can be ECL isoplanar memories F 10405 from Fairchild each having an organisation of $128 \times 1$-bit but other forms of organisation can also be used.

Each memory unit $M_i$ ($i = 1, 2, \ldots, N$) as shown in FIG. 1 has one data input $D_i$, one data output $S_i$ and seven address inputs $A_0$ to $A_6$. Each memory element further possesses a write-enable input which inputs are all connected in parallel to a common write-enable input terminal $\overline{W}$.

The seven address inputs $A_0$ to $A_6$ are connected respectively to the outputs $\overline{Q}_1$ to $\overline{Q}_7$ of a synchronous Gray counter 1. FIG. 1 shows one embodiment of such a Gray counter which is particularly advantageous due to its simple structure using integrated circuits of the ECL type. This counter comprises D-flip-flops 101, 102, 103 which are formed on a commercially available integrated circuit, f.i. a Fairchild circuit designated F 100131. Similarly, the D-flip-flops 111, 112, 113 are part of another circuit F 100131 and D-flip-flops 121, 122 are realized on a third circuit F 100131 a part of which is not used.

The circuit of the counter 1 further includes a number of logic gates which are also formed on commercially available integrated circuits. They are grouped as indicated by the broken line blocks 140, 150, 160, 170, 180 shown inside counter 1. Blocks 140, 150 and 170 are each formed by one F 95101 circuit from Fairchild, block 160 is a Fairchild circuit F 95105 and block 180 is a Fairchild circuit F 100101. It is to be noted that some of the inputs of these gates are not used and designated n.u.

The connections between the different elements of the circuit of FIG. 1 are as shown in that figure. Power supply connections are made as prescribed by the integrated circuit manufacturer. Resistors r have a value of 50 Ohm. The unused inputs of the memory are connected to a supply voltage of $-2$ volts and the inputs and outputs of the counter which are not used (designated n.u.) are left floating. Clock pulses are supplied to the input H of the Gray counter 1 for the control thereof.

The operation of the memory device according to the invention will now be illustrated for the two main applications, namely the case in which input data are synchronous with respect to the clock signal and the case in which input data are asynchronous with respect to the clock. In other words, in the first case input data levels change in synchronism with the levels of the clock signal and in the second case input data levels do not change in synchronism with those of the clock signals.

The timing diagrams now discussed are used to describe the memory device qualitatively. No significance is given to the absolute values of pulse lengths or pulse ratios shown. Relative positions depending on constant delays are not important as they do not influence the speed capabilities of the memory device. In any case constant delays can generally be and are generally compensated for by elements external to the memory.

Figure 2A:
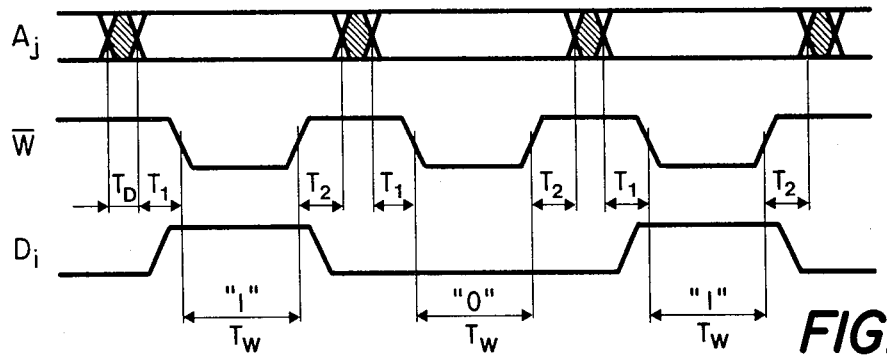
FIGS. 2A and 2B are timing diagrams illustrating the recording of synchronous serial data with an ordinary binary addressed RAM and with a device according to the invention, respectively.

FIG. 2A shows the timing diagram of the address signals designated by $A_j$, the write-enable signal $\overline{W}$ and the input data signal designated $D_i$, in the case of a memory device wherein a random access memory is associated with an ordinary binary address counter. The dispersion of the arrival times of the address signals at the external connections of the RAM are shown by $T_D$. The transitions of the write-enable signal $\overline{W}$ must be set off with respect to the edges of the address pulses as shown by time intervals $T_1$ and $T_2$ in the diagram of FIG. 2A, in order to guarantee the correct writing of the input data in a desired memory location. The durations $T_1$ and $T_2$ are given for a given integrated memory circuit and are generally specified by the manufacturer. Duration $T_W$ is the minimal duration necessary for writing information into a memory cell and must therefore be observed in any case. The line $D_i$ represents an example of a serial data stream 1-0-1 wherein 1 and 0 correspond to the usual designations of the possible binary states.

It results from the diagram of FIG. 2A that in a binary addressed RAM a part of the duration of the address pulses $A_j$, namely the duration $T_1 + T_2$, can not be used for writing in order to guarantee correct writing into a desired memory location. Therefore the speed of writing is limited accordingly in this case.

Figure 2B:
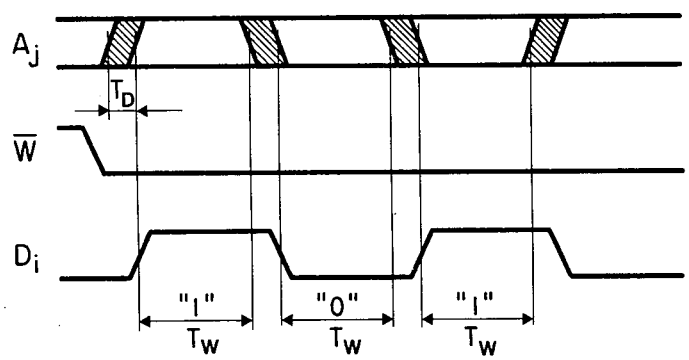

FIG. 2B is a similar timing diagram showing the recording of data by means of a device according to FIG. 1. In this device a Gray counter is used as address counter. The Gray code is a cyclic code and on the contrary to the ordinary binary code the passage from one combination to the following only involves the change of a single code element (bit), as described f.i. by P. Naslin in "Circuits logiques et automatismes à séquences", second edition Dunod, Paris 1965, pages 12 to 14). In the operation of the memory device according to the invention, the security intervals $T_1$ and $T_2$ shown in FIG. 2A can be suppressed and the write enable signal $\overline{W}$ can be continuously in a state to allow recording of data $D_i$ in accordance with the address pulses $A_j$. The frequency of the data pulses to be recorded can therefore be substantially higher than in the case of FIG. 2A.

Figure 3A:
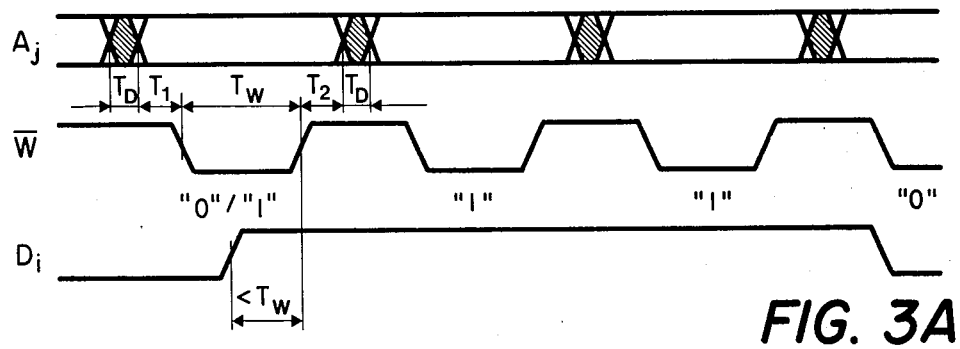
FIGS. 3A and 3B are timing diagrams illustrating the recording of asynchronous data respectively with an ordinary binary addressed RAM and with a device according to the invention.
Figure 3B:
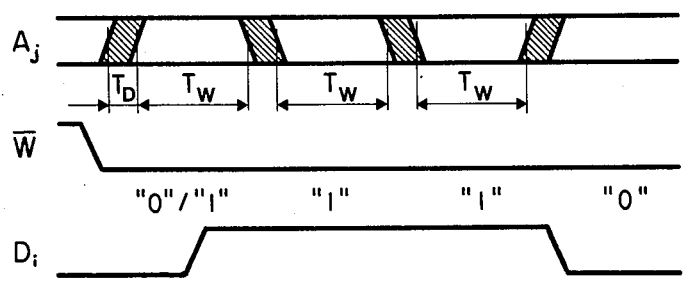

FIGS. 3A and 3B show an operation mode in which the data levels do not change in synchronism with the address signal levels. In this case the transition of the data signal in one direction and/or the other is significant. For instance one likes to know the position of one transition with respect to another transition of the data signal or with respect to a certain transition of the clock signal (e.g. with respect to the last clock transition if the clock signal is stopped after a number of recording cycles).

FIG. 3A shows in a similar way as FIG. 2A the address signals $A_j$, the write-enable signal $\overline{W}$ and the data signal $D_i$. In this case of a binary addressed RAM the write-enable signal must again be used to prevent recording during the transitions of the address signal $A_j$. The duration $T_W$ is also again the minimal duration of a pulse applied to the memory for bringing a memory cell into the 1- or into the 0-state. Similarly as in FIG. 2A time intervals $T_1$, $T_2$ are necessary to guarantee correct writing into a desired memory cell. $T_D$ is the dispersion of the address arrival times at the external memory connections.

FIG. 3B shows the same signals as above when using a memory device in accordance with the invention. In this case it is not necessary that the write-enable signal $\overline{W}$ is used to prevent a writing during the transitions of the address signal. Similarly as in the case of synchronous recording this allows to suppress the time intervals $T_1$ and $T_2$ and to increase the frequency of the clock signal which in practice is mainly limited by the duration $T_W$ given by the memory itself. If $f_H$ designates the clock frequency, the relative position of the transitions of signal $D_i$ with respect to each other can be determined with a precision not better than $\pm 1/f_H$. An increase of the clock frequency as it becomes possible in the memory device according to the invention therefore allows to reduce the error in the last mentioned operating mode. On the other hand, if compared with a usual shift register having the same recording speed, the memory device according to the invention has a substantially increased bit capacity while using very simple and economic means.

It is to be noted that $T_W$ referred to above is the required pulse duration of the write-enable or data signal applied to the external connections of the memory in order to guarantee proper writing into a determined memory cell. Whether the addressed memory cell of the memory actually sees the data during all the time of the external applied signal pulse or only during part of it depends on the addressing technique used and on the type of RAM used. The consequences thereof will be discussed by way of example in connection with FIG. 4.

It can further be noted that the synchronous Gray counter illustrated in FIG. 1 is one example for the realization of such a counter while other solutions are also possible. The shown example is particularly simple and has a high speed capability. Counter 1 counts sequentially through all possible positions which in the illustrated case are of $2^7$. The order of counting through these $2^7$ positions is not important for the operation of present device as this order is the same for recording and read-out when the same counter is used for both. Furthermore it is generally not necessary to provide for resetting of the device which again allows to simplify the present memory device.

As mentioned above, the Gray counter used in the example of FIG. 1 constitutes an address code generator in which each address code differs from the preceding one by only one bit. In other words, each combination of output states shows with respect to the preceding combination a change of state at only one of the counter outputs $Q_1$, $Q_2$, . . . or $Q_7$, the others remaining unchanged. This is the characteristic feature required for the address generator used in the memory device according to the invention.

A Gray counter is one example of an address code generator presenting this feature. Other examples are f.i. synchronous counters as described in "Semi-Conductor Memories, Data, Applications, reliability report" by Monolithic Memories, Inc., 1975, p. 227–234, Application note 102 "ROM in sequential and combinatorial logic". Such a synchronous counter device can be programmed to provide the desired address code satisfying the said characteristic feature. Besides the Gray code other suitable codes can f.i. be derived from the matrix of combination as shown in the book of P. Naslin referred to above, p. 48, FIG. 2.21. The shown example concerns a 4-bit code and suitable codes derived therefrom are f.i. the following examples (A) and (B).

| Example (A) | Example (B) |
|---|---|
| 0000 | 0000 |
| 0001 | 1000 |
| 0011 | 1001 |
| 0010 | 1011 |
| 1010 | 1010 |
| 1110 | 1110 |
| 0110 | 1111 |
| 0111 | 1101 |
| 1111 | 1100 |
| 1011 | 0100 |
| 1001 | 0101 |
| 1101 | 0111 |
| 0101 | 0110 |
| 0100 | 0010 |
| 1100 | 0011 |
| 1000 | 0001 |

In a similar way codes can be determined for any desired number of bits.

Changes from one address code to the following are caused by a clock signal emitted by a usual clock signal source.

It is to be noted, that in cyclic address code generators to be used in the device of the invention, the said characteristic feature also applies to the first address code of a sequence with respect to the last address code of the preceding sequence.

The use of a cyclic address code generator allows sequential recording during a time period of any desired duration in a circular manner. Old information is then overwritten by new information, so that only the input data recorded during the last full sequence, i.e. the last passage through all sequentially addressed memory locations are available for read out.

The description of FIGS. 2A to 3B allows to appreciate the approximate gain in recording speed which can be obtained by the memory device according to the invention. The memory units $M_i$ with their associated address decoders realized on the same monolithic crystal have been represented and considered in FIG. 1 as black boxes independently of their internal structure. Generally speaking the recording speed of a memory device is limited not only by the dispersion of the external delays but also by the internal dispersions inside the memory. The following description shows how these different dispersions influence the recording speed in the different addressing techniques used.

Figure 4:
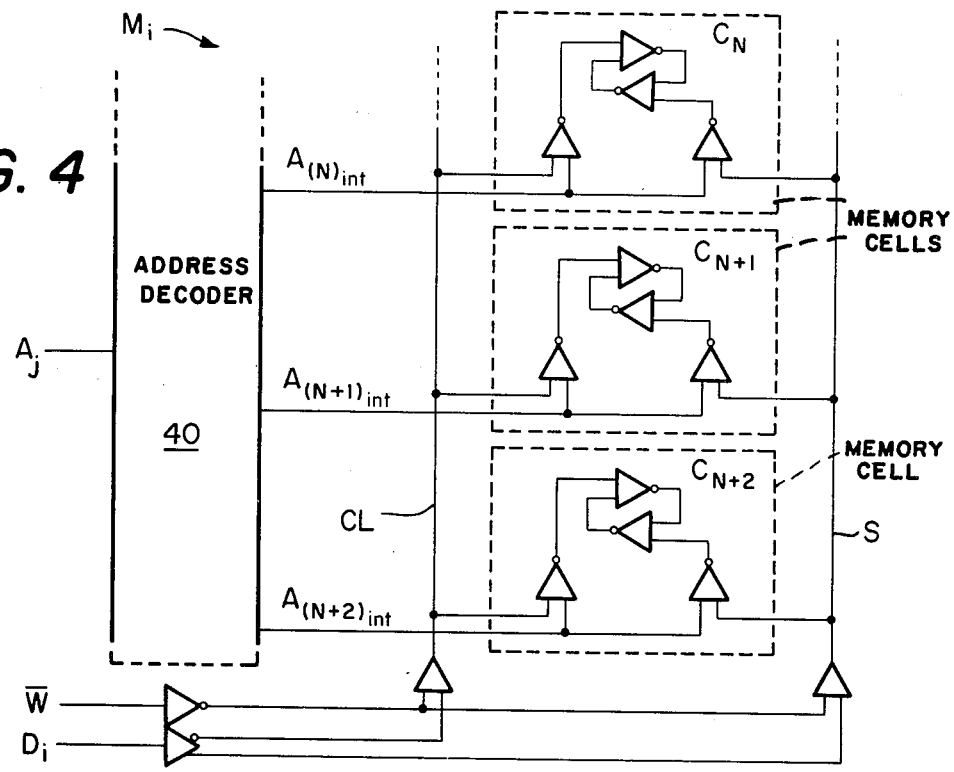
FIG. 4 is a more detailed circuit diagram of a memory unit which can be used in the device according to the invention.

FIG. 4 shows in more detail a random addressed memory $M_i$ comprising a number of memory cells $C_X$, three of which have only been represented, namely $C_N$, $C_{N+1}$ and $C_{N+2}$. The memory $M_i$ further includes an address decoder 40 having a number of external address inputs schematically designated by $A_j$ and internal address outputs $A_{(X)int}$, three of which have only been represented, namely $A_{(N)int}$, $A_{(N+1)int}$ and $A_{(N+2)int}$, these decoder outputs being connected to the corresponding memory cells. Furthermore, write-enable and data inputs are provided and connected as shown in FIG. 4 where they are designated as previously by $\overline{W}$ and $D_i$, respectively. Depending on the states of $\overline{W}$ and $D_i$ set and clear signals are applied to the memory cells as shown on the corresponding conductors in FIG. 4 where these signals are designated by S and CL respectively. Writing in a selected cell $C_X$ takes place when S or CL are at the high level, S being the logic AND combination of D and W and CL being the logic AND combination of $\overline{D}$ and W.

Figure 5:
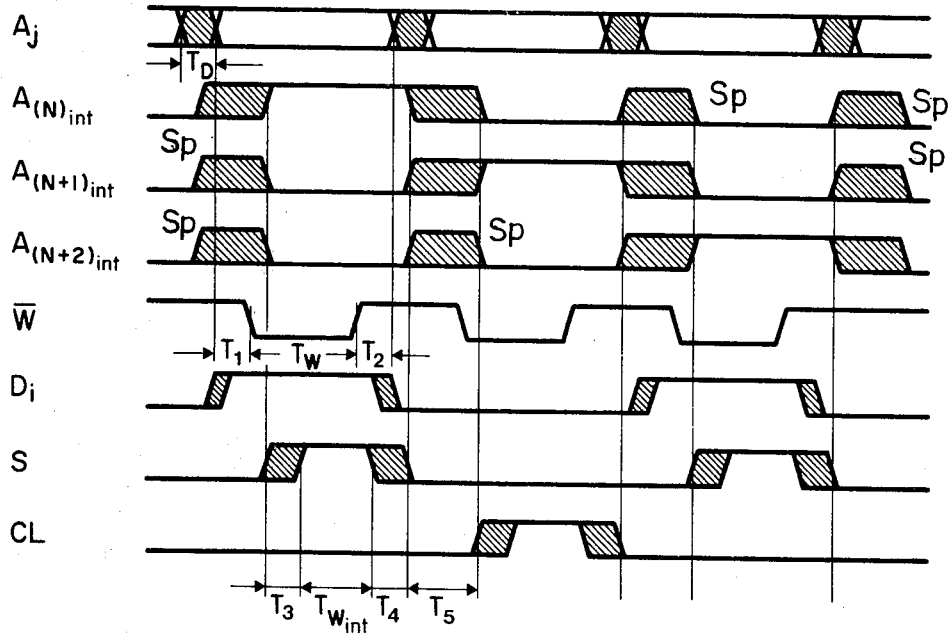
FIG. 5 is a timing diagram taking into account the delay times inside a memory unit in the case of a binary addressed RAM.
Figure 6:
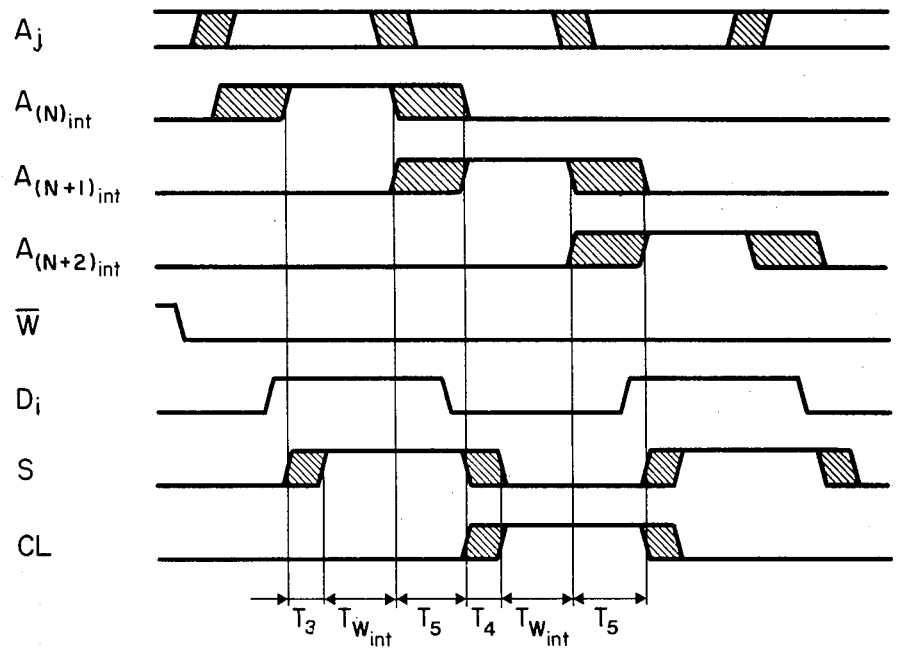
FIG. 6 is a timing diagram similar to that of FIG. 5 in the case of a memory device according to the invention recording synchronous input data.
Figure 7:
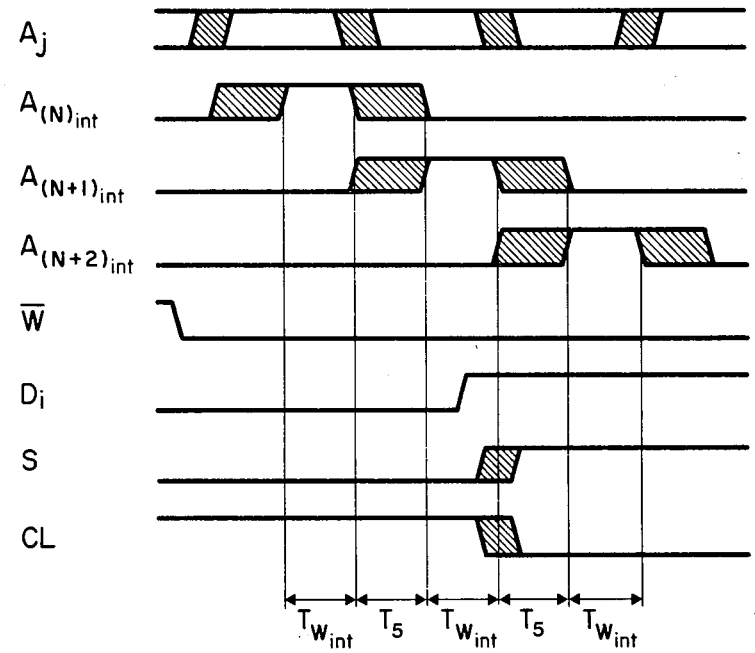
FIG. 7 is a timing diagram similar to that of FIG. 5 in the case of a memory device according to the invention recording asynchronous input data.

Referring now to FIGS. 5, 6 and 7 which illustrate the three different cases of use of a RAM, namely ordinary binary addressing, Gray addressing and synchronous input data, Gray addressing and random (asynchronous) input data, the following general remarks apply. It is supposed that in all three cases RAM's of the same type are used, it being understood that the memory device is generally built up of a large number of memory units $M_i$ connected in parallel. The propagation delays of the $A_{(X)int}$, S and CL signals can be different from one memory unit to the other even if these are of the same type and even when addressing the same memory cell in the different memory units. The shaded parts in the diagrams represent the superposition of all signals of the same function in the various memory units used. The width of the shaded areas shows and is determined by the dispersions of the various signals in a commercially available RAM. These widths are shown to be the same in FIGS. 5, 6 and 7 as the same type of memory units is used in all three cases. The minimum duration of the set or clear signals to guarantee correct writing into a memory cell is designated by $T_{Wint}$ and is also the same in the three different cases.

The timing diagrams show the signals appearing at the corresponding connections or conductors of FIG. 4 and are designated by the symbols as used in FIG. 4.

FIG. 5 illustrates the case of recording with ordinary binary addressing. It will be seen that besides the regular internal address pulse spurious signals can appear on the decoder outputs $A_{(X)int}$. Those spurious signals have been indicated by sp in the corresponding lines of FIG. 5. For instance, during the transition from the decoder output $A_{(N)int}$ to $A_{(N+1)int}$ a spurious signal can appear on $A_{(N+2)int}$. If in such a case a set or a clear signal has been active during the transition from cell $C_N$ to cell $C_{N+1}$ for writing into one of these cells, than the memory cell $C_{N+2}$ can be disturbed. As those spurious signals can appear on any decoder output, the set and clear signals S, CL may only be active outside the areas where the decoder can produce spurious signals. As shown in FIG. 5, each record cycle has therefore a duration of $$T_3 + T_4 + T_5 + T_{W\,int}$$

wherein $T_3$ and $T_4$ represent the dispersion of the leading and trailing edges respectively of the set or clear signal and $T_5$ is the interval during which spurious signals can appear, which corresponds to the dispersion of the edges of an address signal at the decoder output.

FIG. 6 illustrates the recording of synchronous input data in a RAM unit addressed according to the invention. No spurious decoder output signals are produced in this case and therefore the write-enable signal can allow writing continuously. As a consequence, one or the other of the set or clear signals can always be present. The set or clear signal of an addressed location must last until the end of the corresponding address signal to prevent a new set or clear signal from disturbing the previous memory cell. This situation is illustrated in FIG. 6. The length of one recording cycle is accordingly $$T_3 + T_5 + T_{W\,int}$$

or $$T_4 + T_5 + T_{W\,int}.$$

FIG. 7 illustrates the recording of random input data in a RAM unit addressed according to the invention. In this case the input data pulses must be wider than the duration of two sequential address cycles to guarantee writing in at least one location. In this application it is generally intended to determine always the same polarity of an input data transient with respect to other data transients of the same polarity and/or with respect to the last clock pulse after the address counter has been stopped. Therefore the length of the data pulse determinint the length of the set or clear signal is not of primary importance. FIG. 7 shows that the recording cycle in this case is constituted by $$T_5 + T_{W\,int}.$$

The comparison between the limitations inherent to the cases illustrated by FIGS. 5, 6 and 7 show clearly the important gain in recording speed which is obtained by the memory device according to the invention with respect to an ordinary binary addressed RAM.

I claim:

1. A serail access memory device made in integrated circuit technology and comprising a random access memory including one or more memory units each incorporating an associated address decoder, said random access memory having at least one data input, at least one data output, at least one write-enable input and at least two address inputs, and further comprising a sequential address code generator having a plurality of address outputs and a control input, said control input being connected to a clock signal source and each address output being connected to a corresponding one of the said address inputs of the random access memory, the combination of states of all address outputs at a given time constituting an individual address code determined by the structure of the address code generator and a change from a generated address code to the following one being caused by a clock signal emitted by the said clock signal source, wherein the address code generator is arranged for successively producing binary address codes in which the state of only one of the address outputs changes from one address code to the following.

2. A serial access memory in accordance with claim 1, wherein the said address code generator is a cyclic code generator.

3. A serial access memory device made in integrated circuit technology and comprising a random access memory including one or more memory units each incorporating an associated address decoder, said random access memory having at least one data input, at least one data output, at least one write-enable input and at least two address inputs, and further comprising a synchronous Gray address counter having address outputs which are each connected to a corresponding address input of the random access memory and having a control input connected to a clock signal source.

4. A serial access memory in accordance with any preceding claim, wherein the write-enable input is continuously effective to allow writing during the whole recording period.

* * * * *